United States Patent
Ono

(10) Patent No.: US 6,844,576 B2
(45) Date of Patent: Jan. 18, 2005

(54) MASTER SLICE TYPE SEMICONDUCTOR INTEGRATED CIRCUIT AND METHOD FOR DESIGNING THE SAME

(75) Inventor: Yoshiteru Ono, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 61 days.

(21) Appl. No.: 10/232,119

(22) Filed: Aug. 30, 2002

(65) Prior Publication Data

US 2003/0006435 A1 Jan. 9, 2003

Related U.S. Application Data

(62) Division of application No. 09/509,307, filed on Jun. 22, 2000, now Pat. No. 6,476,425, which is a continuation of application No. PCT/JP99/03955, filed on Jul. 23, 1999.

(30) Foreign Application Priority Data

Jul. 23, 1998 (JP) ............................................ 10-208407

(51) Int. Cl.$^7$ ............................................ H01L 27/108
(52) U.S. Cl. ...................... 257/207; 257/690; 257/700; 257/734; 257/748; 257/909; 438/982; 438/279
(58) Field of Search ................................. 257/207, 690, 257/700, 734, 748, 909

(56) References Cited

U.S. PATENT DOCUMENTS 5,224,057 A    6/1993 Igarashi et al.
6,476,425 B1 * 11/2002 Ono ........................... 257/207

FOREIGN PATENT DOCUMENTS

| JP | 58-119648 | 7/1983 |
|----|-----------|--------|
| JP | 62-150740 | 7/1987 |
| JP | 2-177345  | 7/1990 |
| JP | WO 00-05764 | 2/2000 |

* cited by examiner

*Primary Examiner*—Fetsum Abraham
(74) *Attorney, Agent, or Firm*—Hogan & Hartson, LLP

(57) ABSTRACT

A placing and wiring method for a master slice type semiconductor integrated circuit is provided. The method is conducted by an automatic placing and routing apparatus with respect to a master slice 100 having a plurality of basic cells 110 formed in a matrix, in which first and second power source wirings 170 and 171 that traverse the plurality of basic cells 110 are connected to a plurality of signal wirings that are formed along a vertical direction to provide connections within each of the plurality of basic cells 110 and/or between the plurality of basic cells 110. The method includes: a first step of registering in the automatic pacing and routing apparatus definitions of effective pin positions A1–A14, B2–B13 and C1–C14; a second step of registering a net list in the automatic placing and routing apparatus; and a third step of determining the placement of pin positions and wiring routes, based on data for the definitions of the effective pin positions and the net list. The registered effective pin positions are provided on lattice grids 120, located inside and outside a region between the first and second power source wirings 170 and 171. In the circuit wired according to the definitions, contacts with respect to the drains are provided inside and outside the region between the first and second power source wirings 170 and 171, and the signal wirings do not cross the power source wirings.

16 Claims, 7 Drawing Sheets

MASTER SLICE TYPE SEMICONDUCTOR INTEGRATED CIRCUIT AND METHOD FOR DESIGNING THE SAME

This application is a Division of U.S. Ser. No. 09/509,307 filed Jun. 22, 2000 U.S. Pat. No. 6,476,425 which is a continuation of PCT/JP99/03955 filed Jul. 23, 1999.

FIELD OF THE INVENTION

The present invention relates to a master slice type semiconductor integrated circuit, such as a gate array or an embedded array, and a method for manufacturing the same. More particularly, the present invention relates to improvements in making the effective use of wiring resources.

TECHNICAL BACKGROUND

Master slice type semiconductor integrated circuits, such as, for example, gate arrays and embedded arrays, are manufactured using an unfinished wafer (master slice) in which those process steps to be performed before the metal wiring step are completed. The master slice is wired according to specific circuit functions required by the user and coated with a protection film, to thereby provide a finished wafer. Unfinished wafers may be stocked such that the delivery time is shortened to deliver semiconductor integrated circuits to customers.

Prior to manufacturing master slice type semiconductor integrated circuits, an unfinished wafer having basic cells arranged in a matrix is prepared in advance. Provision of through holes and placement and wiring of metal wiring layers to the unfinished wafer are automatically performed by an automatic placing and routing apparatus.

There is a growing tendency in which the number of metal wiring layers is increased, for example, from the two-layer to the three-layer and to the four-layer. The bottommost or first metal wiring layers in a semiconductor integrated circuit of the type described above are used as signal input wirings for inputting signals to gates of MOS transistors that form basic cells, power supply wirings for supplying power to sources thereof and signal output wirings for outputting signals from drains thereof, for example. These wirings are connected to the gates, sources or drains through contacts. Also, first metal wiring layers may be used as power source wirings for supplying power source voltages, such as potentials VDD and VSS, and signal wirings that provide connections within basic cells and between basic cells. Other metal wiring layers, such as second and third metal wiring layers, are used mainly as signal wirings.

Aluminum layers are generally used as metal wiring layers. For example, a two-layer metal wiring layer may include a first Al wiring and a second Al wiring. When wiring routes of the first and second Al layers are determined by an automatic placing and routing apparatus, priority wiring directions are respectively assigned to the first and second Al wirings.

It is noted that it is more difficult to miniaturize a master slice type semiconductor integrated circuit having a plurality of metal wiring layers compared to a standard cell type that is designed using basic cells registered in a library.

For example, let us consider one wiring example in which a signal wiring is externally lead out from a region between two power source wirings in the first layer (VDD, VSS) that are formed in a first priority wiring direction, for example. In this case, if the two power source wirings and the signal wiring are formed with the first layers, they are short-circuited. In order to cross over the power source wirings formed in the first priority wiring direction, the signal wiring has to be formed with a first layer signal wiring, a second layer signal wiring and a via that connects the first and second layer signal wirings. The second layer signal wiring is used only to cross over the first power source wiring. As a consequence, other wirings cannot be formed in such a region in the second layer. The other wirings in the second layer may need to take a detour. In this manner, the routing resource for the second layer is exhausted.

For the convenience of explanation, let us assume, for example, there are 100 lateral lines×100 vertical lines of lattice grids in a three-layer metal wiring structure, and the priority wiring direction for the first and third layers is the lateral direction and the priority wiring direction for the second layer is the vertical direction. In this case, while the first and third layers provide a total of 200 wiring lines in the lateral direction as the routing resource, the second layer provides 100 wiring lines in the vertical direction as the routing resource.

It is noted that the placement of the metal wirings in the first layer is mostly determined by the placement of basic cells, and the number of usable wiring lines is determined as a matter of course. Therefore, if the wirings in the second and third layers are disposed in a well-balanced manner, the size of the chip can reduced. However, as described above, if the wirings in the second layer are used to cross over the wirings in the first layer, the wiring efficiency of the second layer deteriorates.

In addition, when a roundabout routing of wirings is implemented by connecting a plurality of layers with vias, or a roundabout routing of wirings is made within the same layer, the wiring length increases. Moreover, in recent years, the line width has become narrower as the semiconductor manufacturing process has become more miniaturized. As a result, the resistance of the wiring per unit length tends to increase. Because of these two major factors, problems arise in that the wiring resistance is increased, and the signal delay is thus increased.

In solving these problems, the inventors of the present application have paid attention to the fact that the wiring resource of metal wiring layers and, in particular, the wiring resource of second metal wiring layers are not effectively utilized.

It is an object of the present invention to provide a master slice type semiconductor integrated circuit and a design method therefor that make an effective use of the wiring resource of metal wiring layers to thereby increase the wiring efficiency and reduce the chip size.

Another object of the present invention is to provide a master slice type semiconductor integrated circuit and a design method therefor that prevent the increase in the wiring resistance and reduce the signal delay as much as possible by making an effective use of the wiring resource of metal wiring layers to thereby increase the wiring efficiency.

SUMMARY OF THE INVENTION

In accordance with one embodiment of the present invention, a placing and wiring method for a master slice type semiconductor integrated circuit is provided. The method is conducted by an automatic placing and routing apparatus with respect to a master slice having a plurality of basic cells formed in a matrix, in which first and second power source wirings that are formed along a first direction and traverse the plurality of basic cells are connected to a plurality of signal wirings that are formed along the first direction or a second direction that traverse the first direction to wire within each of the plurality of basic cells and/or between the plurality of basic cells.

The method according to the embodiment includes: the first step of registering in the automatic placing and routing apparatus that defines the first direction or the second direction as a priority wiring direction definitions of effective pin positions that connect the plurality of signal wirings, the plurality of first and second power source wirings and the plurality of basic cells for each of layers in which the wirings are formed; the second step of registering a net list that defines connections among the plurality of basic cells in the automatic placing and routing apparatus; and the third step of determining the placement of actual pin positions and wiring routes for the first and second power source wirings and the plurality of signal wirings based on data for the definitions of the effective pin positions and the net list.

The first step includes the step of defining the effective pin positions inside and outside of a region between the first power source wiring and the second power source wiring, in a region corresponding to one of a plurality of component layers with which transistors of the plurality of basic cells are formed and on lattice grids along which the plurality of basic cells are formed.

The third step includes the step of connecting one of the plurality of component layers and two of the plurality of signal wirings at the determined pin positions, in which two of the plurality of signal wirings are connected by the one component layer alone.

A semiconductor integrated circuit in which wirings are conducted in accordance with one embodiment of the present invention includes two contacts that connect one of a plurality of component layers with which transistors of a plurality of basic cells are formed and two of a plurality of signal wirings, wherein the two contacts are respectively disposed inside and outside of a region between a first power source wiring and a second power source wiring, and the two of the plurality of signal wirings are connected to one another by one of the component layers alone.

As a result, the signal wirings do not need to cross over the first and second power source wirings, and accordingly the wiring resource is effectively utilized. Also, the wiring length of the signal wirings is shortened as compared to a conventional structure in which signal lines cross over first and second power source wirings. Accordingly, one of the sources of signal delay can be eliminated. In accordance with one embodiment of the present invention, one of the component layers other than layers in which first and second power source wirings are disposed is used also as a wiring material to cross the signal wirings over the first and second power source wirings and connect them to one another.

In one embodiment, the one component layer may be a diffusion layer. If a Ti silicide is formed on a surface of the diffusion layer, the diffusion layer has a substantially low sheet resistance and can be used as a wiring material.

In this case, in the first step, a plurality of effective pin positions defined at positions on the diffusion layer may preferably be provided inside and outside the region between the first power source wiring and the second power source wiring. Further, in the first step, effective pin positions may be defined at all of the intersections of lattice grids on the diffusion layer. As a result, a wider range is secured in the selection of positions of contacts, and spaces are secured for passing signal wirings from other basic cells.

The basic cell includes a plurality of P-type transistors and a plurality of N-type transistors. The basic cell may be formed in a split-gate type in which a gate layer is provided for each of the plurality of P-type transistors and N-type transistors.

In this instance, in the first step, an effective pin position defined for each of the gate layers is provided in each of the areas inside and outside the region between the first power source wiring and the second power source wiring. As a result, for example, the gate of the P-type transistor is connected to the signal wiring in the area outside the region between the first power source wiring and the second power source wiring, and the gates of the P-type transistor and the N-type transistor can be connected in the area within the region.

The basic cell includes a plurality of P-type transistors and a plurality of N-type transistors. The basic cell may be formed in a common-gate type in which a common gate layer is provided for the plurality of P-type transistors and N-type transistors.

In this instance, in the first step, an effective pin position defined for each of the common gate layers is provided in an area inside the region between the first power source wiring and the second power source wiring, and another effective pin position is provided at each end of the common gate layer outside the region.

As a result, for example, a signal wiring to the first gate or the second gate can be connected to a contact that is disposed outside the region between the first and second power source wirings, and a signal wiring that crosses over the first and second power source wirings is not required.

In a placing and routing method in accordance with another embodiment of the present invention, the first step includes the step of defining the effective pin positions inside and outside a region between the first power source wiring and the second power source wiring, in a region corresponding to a gate layer of each of transistors that form the plurality of basic cells and on lattice grids along which the plurality of basic cells are disposed.

A master slice type semiconductor integrated circuit designed according to the method has:

a substrate having a plurality of basic cells formed in a matrix thereon, first and second power source wirings that are formed along a first direction and traverse the plurality of basic cells, a plurality of signal wirings that are formed along the first direction or a second direction that traverses the first direction to provide connections within each of the plurality of basic cells and/or between the plurality of basic cells, and a contact that connects one of gate layers of transistors that form one of the plurality of basic cells to one of the plurality of signal wirings in an area outside a region between the first power source wiring and the second power source wiring.

In accordance with the method and the circuit designed by the method, one of the gate layers of transistors that form one of the plurality of basic cells can be connected to one of the plurality of signal wirings by a contact disposed outside the region between the first power source wiring and the second power source wiring. In this case, a signal wiring to the gate can be connected to the contact that is disposed outside the region between the first power source wiring and the second power source wiring, and therefore a signal wiring that crosses over the first and second power source wirings is not required.

BEST MODE OF EMBODIMENT OF THE INVENTION

Embodiments of the present invention will be described below with reference to the accompanying drawings.
(Definitions for Effective Pin Positions)

Figure 1:
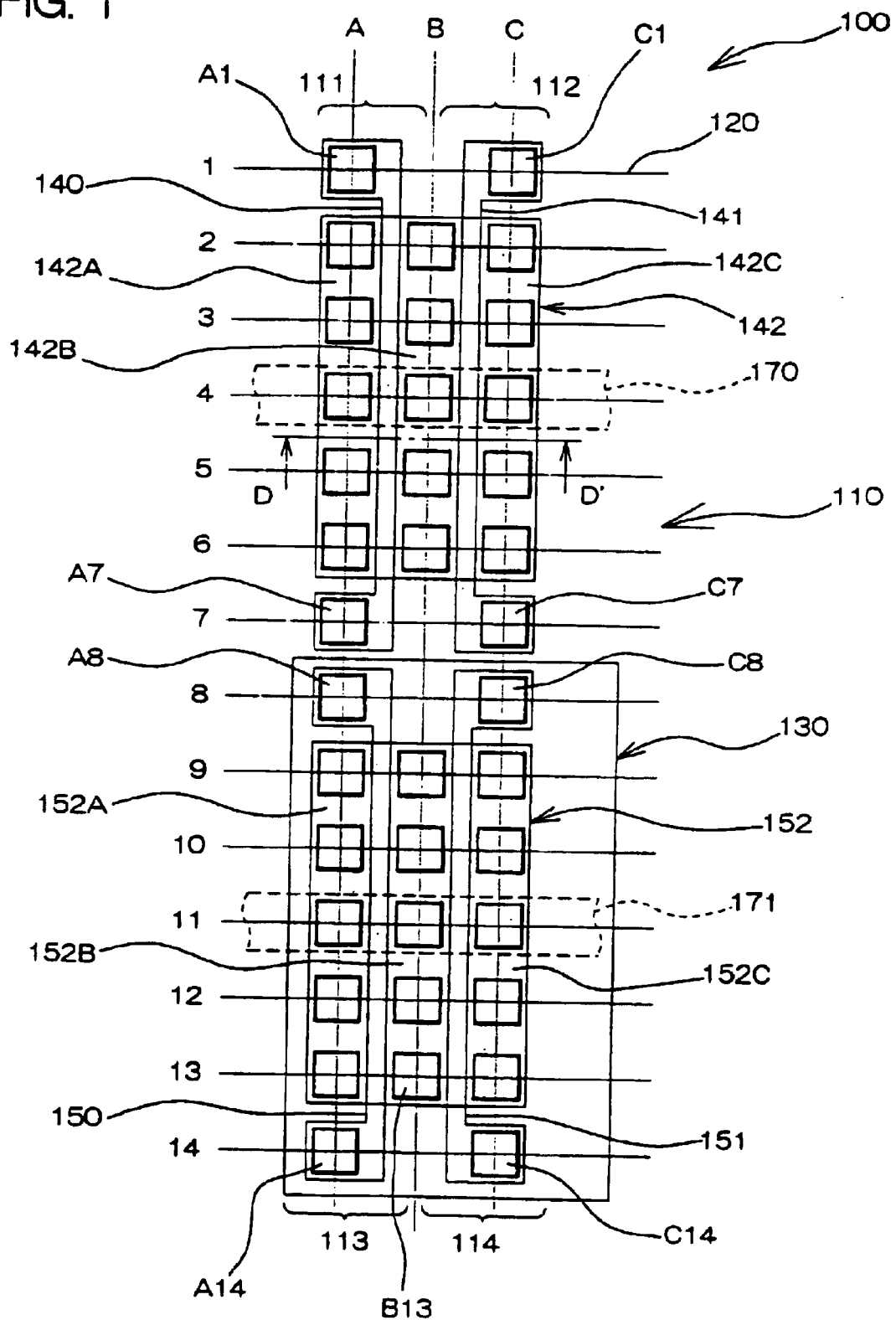
FIG. 1 is an illustration of definitions for effective pin positions in a master slice that has basic cells arranged in a matrix in accordance with one embodiment of the present invention.

FIG. 1 shows definitions for positions of contacts (effective pin positions) on a master slice 100 having basic cells 110 that are arranged in a matrix. It is noted that FIG. 1 shows only one of basic cells 110. FIG. 1 also shows lattice grids 120. All of the positions of the pins and wiring routes are determined on the lattice grids 120 by an automatic placing and routing apparatus.

The basic cell 110 shown in FIG. 1 has two P-type MOS transistors 111 and 112 and two N-type MOS transistors 113 and 114. The structure of the transistors 111–114 will be described with reference to FIG. 2 that shows a cross-sectional view taken along a line D–D' of FIG. 1.

A P-type well 130 is formed in a forming region where the N-type MOS transistors 113 and 114 are formed. The P-type MOS transistors 111 and 112 have polysilicon layers 140 and 141 that function as gates, and a P-type diffusion region 142 that becomes either a source or a drain. Similarly, the N-type MOS transistors 113 and 114 have polysilicon layers 150 and 151 that function as gates and a P-type diffusion region 152 that becomes either a source or a drain.

Figure 2:
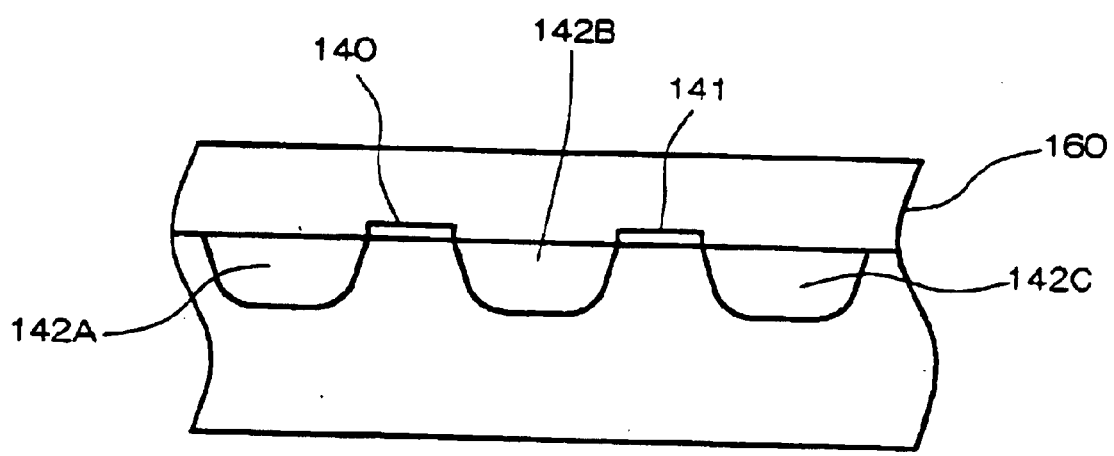
FIG. 2 is a cross-sectional view taken along a line D–D' of FIG. 1.

Referring to FIG. 2 which illustrates a cross section taken along the line D–D' of FIG. 1, an SiO$_2$ film (not shown) that functions as a gate insulation film is formed under the polysilicon layer 140. Similarly, the N-type MOS transistors 113 and 114 have SiO$_2$ films (not shown).

In the description below, the N-type diffusion region 142 is divided into three regions by channel regions immediately below the gates. These three regions are respectively referred to as a first diffusion region (for example, a source) 142A, a second diffusion region (for example, a common drain) 142B and a third diffusion region (for example, a source) 142C. Three regions of the P-type diffusion region 152 are also referred to as a first diffusion region 152A, a second diffusion region 152B and a third diffusion region 152C.

A plurality of the basic cells 110 each having the above-described structure are formed and an insulation layer 160 shown in FIG. 2 is formed thereon to manufacture the master slice 100.

Then, a plurality of metal wiring layers are provided on the master slice 100 to realize a circuit function required by the user. To provide the metal wiring layers, an automatic placing and routing apparatus is used to determine placement and routing of the plurality of wiring layers and pins (contacts and vias).

The automatic placing and routing apparatus determines placement and routing of the plurality of wiring layers and pins based on definitions for effective pin positions registered in a library and a net list that defines definitions for connections between the basic cells.

Referring to FIG. 1, definitions for effective pin positions of contacts registered in the library are shown on the master slice 100. The effective pin positions are those for input pins and output pins to be connected to signal wirings and power source pins to be connected to power source wirings. FIG. 1 also shows for reference a first power source wiring 170 that is set at a potential VDD and a second power source wiring 171 that is set at a potential VSS.

In the description below, pin definition sections illustrated by squares in FIG. 1 are presented with coordinates on lattice grids. In FIG. 1, not all of the pin definition sections are presented with coordinates. However, for example, a pin definition A2 refers to a pin definition section that is located at an intersection of a vertical line A and a lateral line 2.

As shown in FIG. 1, the polysilicon layers 140, 141, 150 and 151 that function as gates are provided with pin definition sections A1, C1, A7, C7, A8, C8, A14 and C14. The first pin definition sections A7, C7, A8 and C8 are disposed within a region defined between the two first and second power source wirings 170 and 171. On the other hand, the second pin definition sections A1, C1, A14 and C14 are disposed outside the region that is defined between the two first and second power source wirings 170 and 171.

As shown in FIG. 1, five pin definition sections A2–A6 and five pin definition sections A9–A13 are provided in the first diffusion regions 142A and 152A, respectively. Among these pin definition sections, the pin definition sections A5, A6, A9 and A10 are disposed within the region that is defined between the two first and second power source wirings 170 and 171. The pin definition sections A4 and A11 are disposed at locations overlapping the first and the second power source wirings, respectively. The pin definition sections A2, A3, A12 and A13 are disposed outside the region that is defined between the two first and second power source wirings 170 and 171.

Similarly, as shown in FIG. 1, five pin definition sections each, namely, B2–B6, B9–B13, C2–C6 and C9–C13, are provided in the second diffusion regions 142B and 152B and the third diffusion regions 142C and 152C, respectively.

In the example shown in FIG. 1, pin definition sections are provided on all of the locations at which the first-third diffusion regions 142A–142C and 152A–152C overlap the intersections of the lattice grids. However, those of the pin definition sections that are not expected to be required may be deleted. However, power source pin definition sections among the plurality of pin definition sections need to be disposed at locations that overlap the first power source wiring 170 or the second power source wiring 171, and input pin definition sections and output pin definition sections may preferably be disposed inside and outside a region defined between the two first and second power source wirings 170 and 171. In contrast, effective pin positions that are not frequently used are the pin definition sections B4 and B11 that are disposed at locations overlapping the first and second power source wirings 170 and 171 over the second diffusion regions 142B and 152B. However, when the second diffusion regions 142B and 152B are used as sources, the pin definition sections B4 and B11 need to be defined.
(Automatic Placing and Routing)

An automatic placing and routing apparatus uses the definitions described above and performs a process for placing and routing the basic cells within a semiconductor integrated circuit. The process will be described with reference to a flow chart shown in FIG. 5.

First, all definitions for positions of pins (contacts, vias and external terminals) including the pin definition sections described above are registered in a library (step 1), and the library is inputted in the automatic placing and routing apparatus (step 2). Further, a net list that defines connections between the basic cells is inputted (step 3). Then, placing and routing of pins with respect to the master slice shown in FIG. 1 are determined (step 4). Automatic routing in step 4 is conducted according to a priority wiring direction that is determined for each of the layers.

Figure 5:
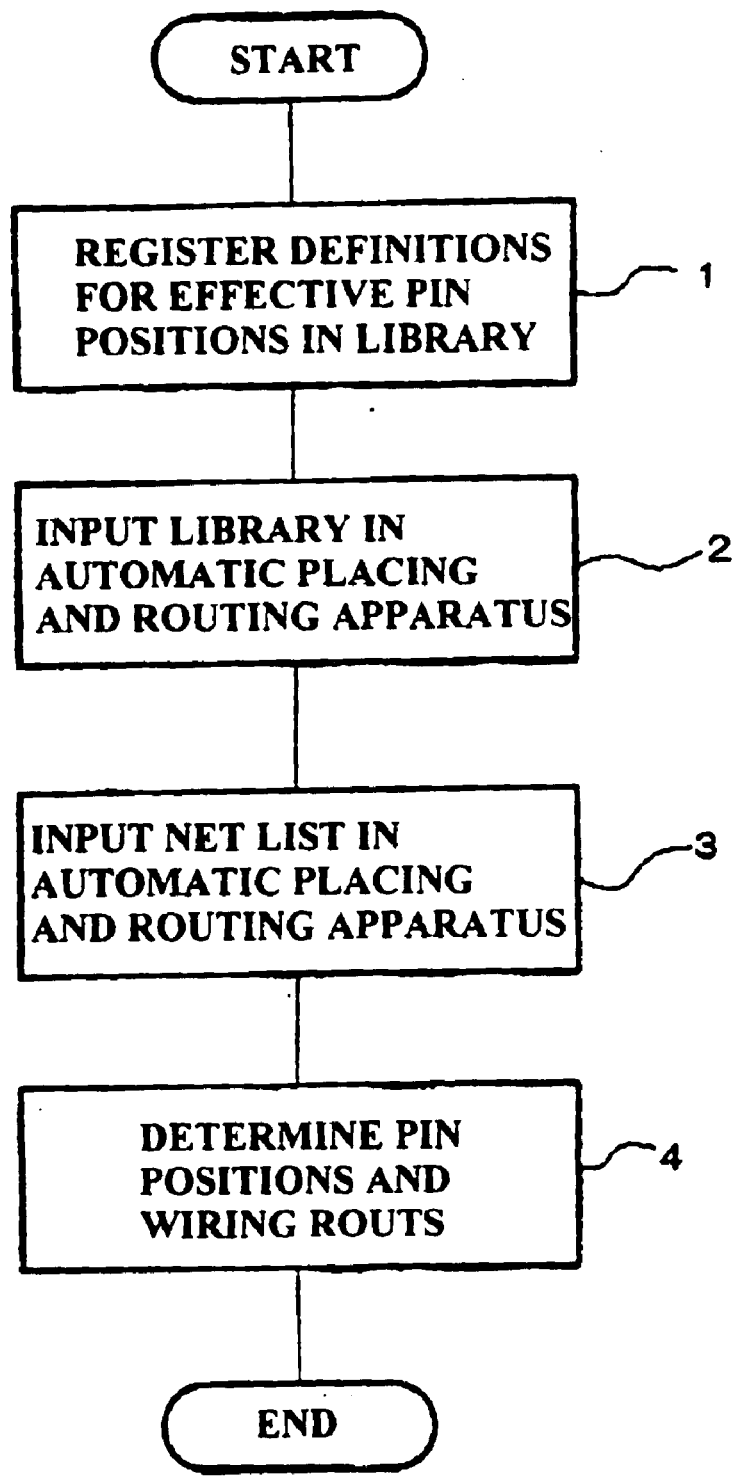
FIG. 5 is a flow chart illustrating steps of an automatic placing and routing process.

Definitions for effective pin positions are registered in a library in step 1 of FIG. 5. One example of the registered definitions is shown in Table 1 below. Coordinates shown in FIG. 1 are coordinates on lattice grids shown in FIG. 3.

TABLE 1

| | PIN DEFINITIONS | |
|---|---|---|
| TYPE | OBJECT | COORDINATES |
| P | First Gate | A1, A7 |
| M | Second Gate | C1, C7 |
| O | First Diffusion Region | A2–A6 |
| S | Second Diffusion Region | B2–B6 |
| | Third Diffusion Region | C2–C6 |
| N | First Gate | A8, A14 |
| M | Second Gate | C8, C14 |
| O | First Diffusion Region | A9–A13 |
| S | Second Diffusion Region | B9–B13 |
| | Third Diffusion Region | C9–C13 |

The pin definitions shown in Table 1 indicate that any one of the pins listed in Table 1 can be optionally selected when wirings are determined according to the net list.

Embodiment Example of Semiconductor Integrated Circuit

Figure 3:
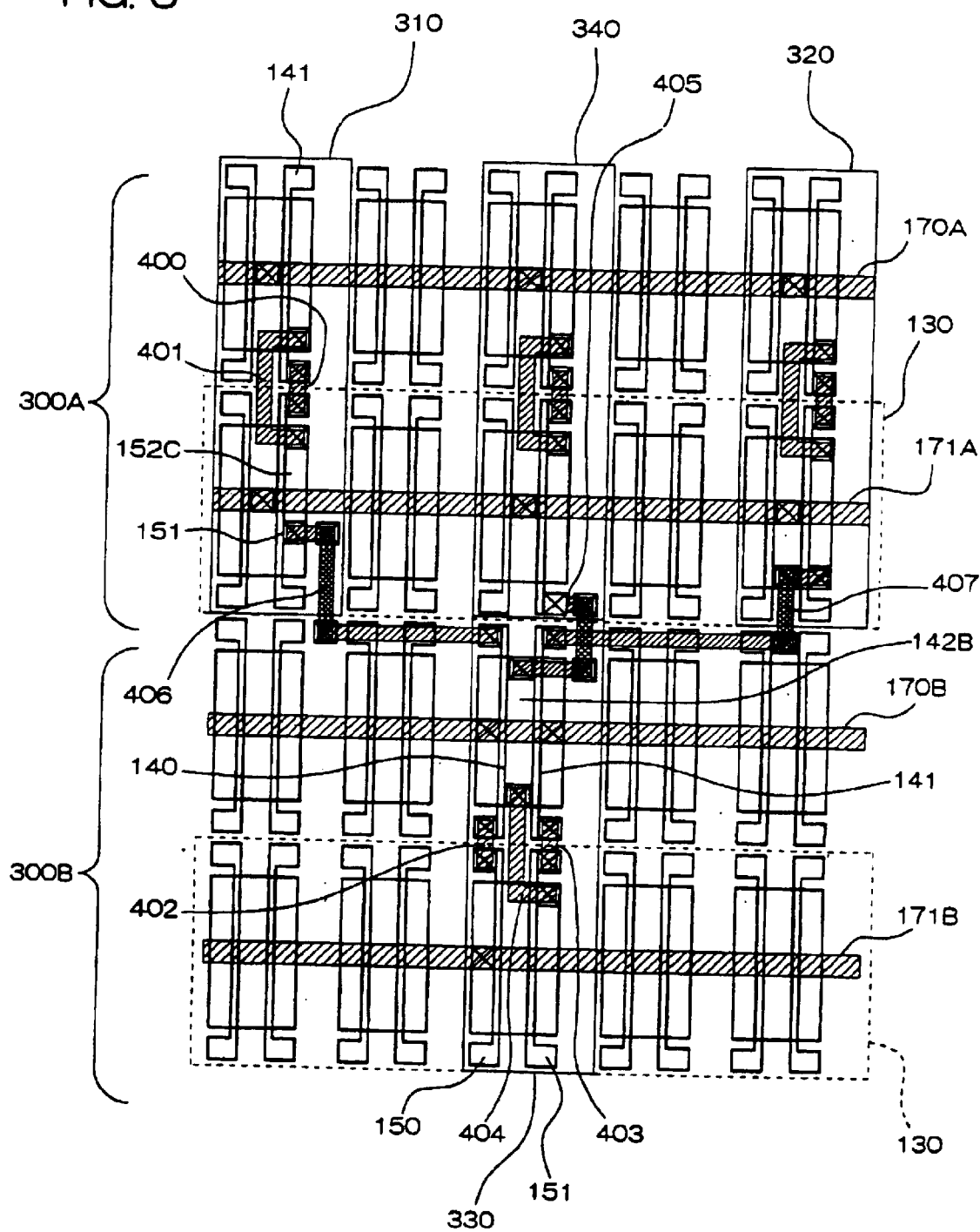
FIG. 3 is a circuit routing diagram of a placing and routing example for a semiconductor integrated circuit that is designed based on library data including the definitions of effective pin positions shown in FIG. 1.

FIG. 3 shows one example of placement and routing for a semiconductor integrated circuit that is designed based on the library data, including the definitions for the effective pin positions described above, and FIG. 4 shows its logic circuit.

Figure 4:
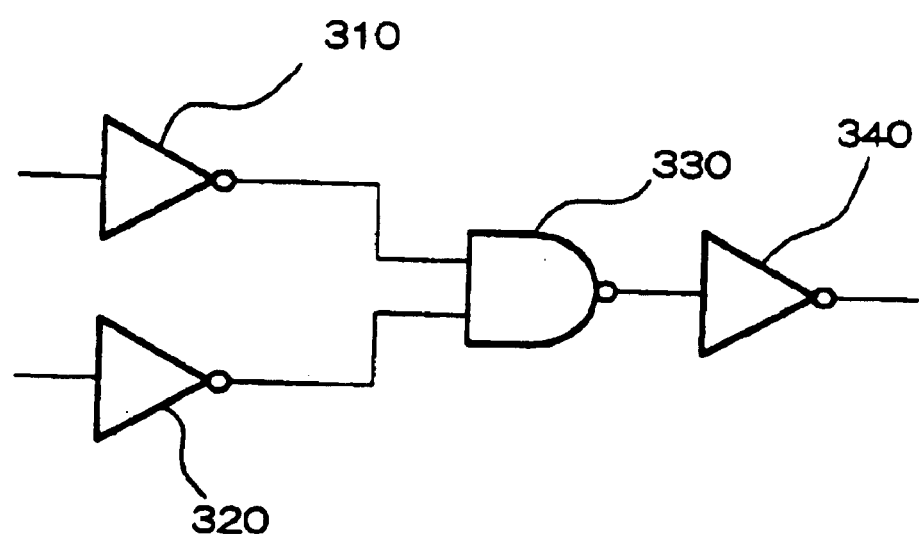
FIG. 4 is a logic circuit diagram of a logic circuit realized by the circuit routing of FIG. 3.

The circuit shown in FIG. 3 provides a logic circuit shown in FIG. 4. The logic circuit has two inverters 310 and 320, a NAND gate 330 in which outputs from the inverters 310 and 320 are inputted, and an inverter 340 that inverts an output from the NAND gate 330.

Each of the two inverters 310 and 320 is respectively formed with one of the basic cells in a first basic cell column 300A, shown in FIG. 3. The NAND gate 330 is formed with one of the basic cells in a second basic cell column 300B, shown in FIG. 3. The inverter 340 is formed with one of the basic cells in the first basic cell column 300A, shown in FIG. 3.

It is noted that wirings shaded with hatching shown in FIG. 3, are metal wiring layers in a first layer, and their priority wiring direction extends in a transverse direction. Wirings shaded with cross-hatching, shown in FIG. 3, are metal wirings in a second layer, and their priority wiring direction extends in a vertical direction.

The first basic cell column 300A, shown in FIG. 3, has first and second power source wirings 170A and 171A formed with the first metal wiring layers along the transverse direction. The second basic cell column 300B also has first and second power source wirings 170B and 171B formed with the first metal wiring layers along the transverse direction.

The first power source wiring 170A and the inverters 310, 320 and 340 are connected to each other through a contact formed at the pin definition section B4, shown in FIG. 1.

The second power source wiring 171A and the inverters 310, 320 and 340 are connected to each other through a contact formed at the pin definition section B11, shown in FIG. 1.

Gates 141 and 151 of P-type and N-type MOS transistors in the first basic cell column 300A that form the inverters 310, 320 and 340 are connected to one another through contacts formed at the pin definition sections C7 and C8, shown in FIG. 1, and a signal wiring 400 formed with the first metal wiring layer. (In FIG. 3, reference numerals are added only for the inverter 310.)

Also, the diffusion regions 142C and 152C of the P-type and N-type MOS transistors in the first base cell column 300A that compose the inverters 310, 320 and 340 are connected to each other through contacts formed at pin definition sections C6 and C9, shown in FIG. 1, and a signal wiring 401 formed with the first metal wiring layer. (In FIG. 3, reference numerals are added only for the inverter 310.)

The first power source wiring 170B and the NAND gate 330 are connected to each other through contacts formed at the pin definition sections A4 and C4, shown in FIG. 1.

The second power source wiring 171B and the NAND gate 330 are connected to each other through a contact formed at the pin definition section A11, shown in FIG. 1.

Gates 140 and 150 of the P-type and N-type MOS transistors in the second basic cell column 300B that forms the NAND gate 330 are connected to each other through contacts formed at the pin definition sections A7 and A8, shown in FIG. 1, and a signal wiring 402 formed with the first metal wiring layer.

Similarly, gates 141 and 151 of the P-type and N-type MOS transistors in the second basic cell column 300B that forms the NAND gate 330 are connected to each other through contacts formed at the pin definition sections C7 and C8, shown in FIG. 1, and a signal wiring 403 formed with the first metal wiring layer.

Further, the second and third diffusion regions 142B and 152C of the P-type and N-type MOS transistors in the second basic cell column 300B that forms the NAND gate 330 are connected to each other through contacts formed at the pin definition sections B6 and C9, shown in FIG. 1, and a signal wiring 404 formed with the first metal wiring layer. The signal wiring 404 is an output line of the NAND gate 330.

Also, the basic cells in the first and second basic cell columns 300A and 300B that form the NAND gate 330 and the inverter 340 are connected to each other through a wiring group 405, consisting of a contact formed at the pin definition section C14, shown in FIG. 1, a signal wiring formed with the first metal wiring layer, a via, a signal wiring formed with the second metal wiring layer, a via, a signal wiring formed with the first metal wiring layer and a contact formed at the pin definition section B2, shown in FIG. 1.

Next, signal wirings among the inverter 310 and 320 and the NAND gate 330 will be described.

An output signal from the inverter 310 is inputted in the NAND gate 330 through a wiring group 406, consisting of a contact formed at the pin definition section C12, shown in FIG. 1, the first layer signal wiring, a via, the second layer signal wiring, a via, the first layer signal wiring and a contact formed at the pin definition section A1, shown in FIG. 1.

An output signal from the inverter 320 is inputted in the NAND gate 330 through a wiring group 407, consisting of a contact formed at the pin definition section C13, shown in FIG. 1, the first layer signal wiring, a via, the second layer signal wiring, a via, the first layer signal wiring and a contact formed at the pin definition section C1, shown in FIG. 1.

(Comparison with Conventional Wiring Pattern)

Figure 7:
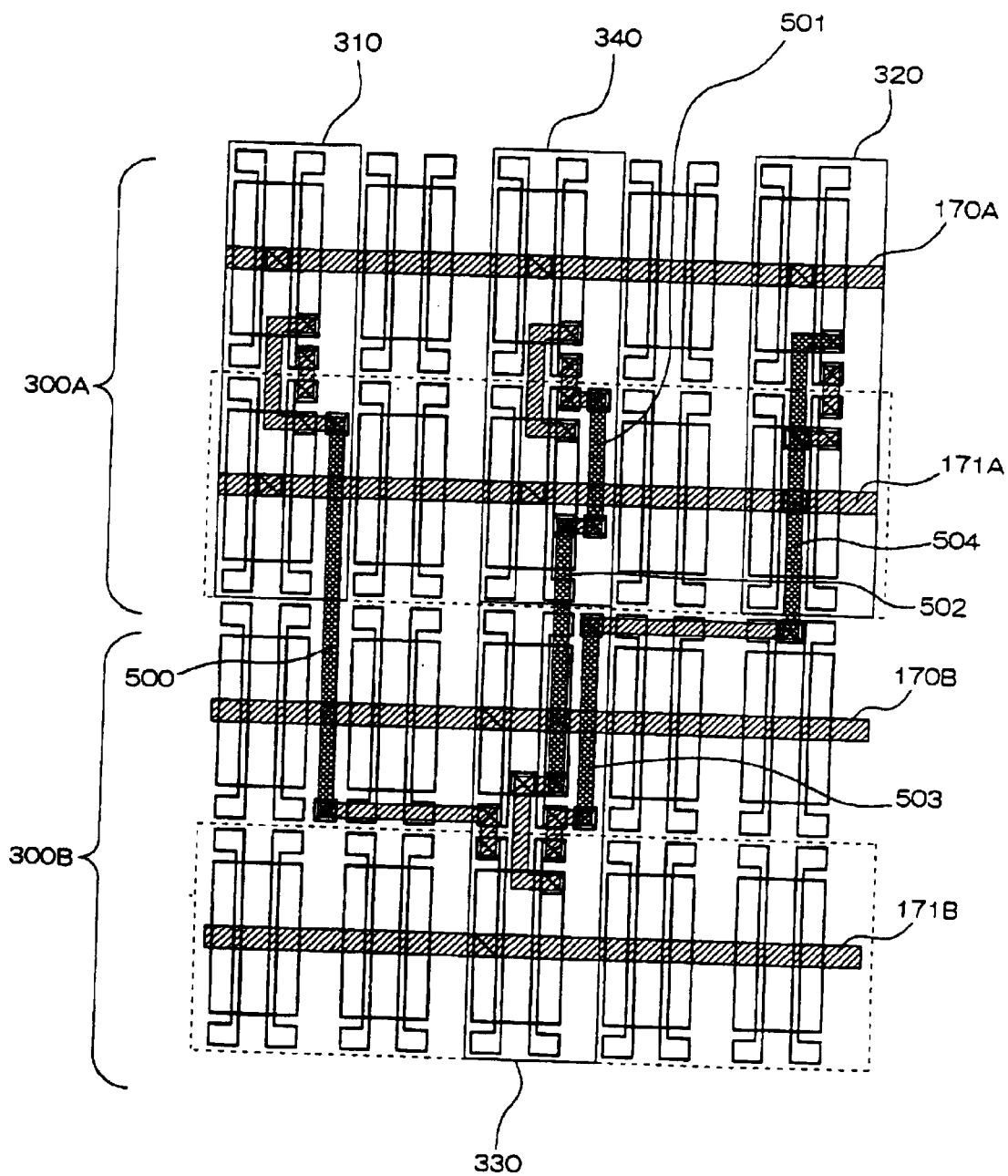
FIG. 7 is an illustration of a conventional wiring pattern of a logic circuit that has the same function as that of the logic circuit having the wiring pattern shown in FIG. 3.

FIG. 7 shows a conventional wiring pattern of a logic circuit that has the same function of the logic circuit having the wiring pattern shown in FIG. 3.

By comparing FIG. 3 with FIG. 7, the following differences between these wiring patterns are observed.

First, the wiring pattern in FIG. 3 does not have any wiring that crosses the first and second power source wirings 170A, 171A, 170B and 171. In contrast, in the wiring pattern in FIG. 7, five signal lines 500–504, formed with the second metal wiring layers, cross the first and/or second power source wirings 171A and 170B.

Secondly, the wiring length of each of the signal wirings that connect the inverters 310 and 320 to the NAND gate 330, shown in the wiring pattern in FIG. 7, is substantially longer than that of the wiring pattern shown in FIG. 3.

It is understood from the above that the conventional wiring pattern shown in FIG. 7 wastes the wiring resource of the second metal wiring layer. Also, since the wiring length of the second metal wiring layer of the wiring pattern shown in FIG. 7 is particularly long, its wiring capacitance and wiring resistance increase. As a consequence, problems of signal delays occur with the advancement of the miniaturized manufacturing process that further narrows the wiring width. Each of the signal wirings that connect the inverters 310 and 320 to the NAND gate 330 is continuous from one end to the other end. In contrast, each of the corresponding signal wirings in FIG. 3 is divided into sections.

For example, no metal wiring exists between the signal wirings 401 and 406 that is connected to the inverter 310 shown in FIG. 3. As a result, the third diffusion region 152C of the N-type MOS transistor that is connected to the signal wirings 401 and 406 is also used as a wiring material. Also, the third diffusion region 152C of the N-type MOS transistor in the first basic cell column 300A that forms the inverters 320 and 340 is used as a wiring material.

Similarly, the signal wirings 404 and 405 in the basic cell in the second basic cell column 300B that forms the NAND gate 330 are connected to each other through the second diffusion region 142B that functions as a wiring material.

Further, for example, in the basic cell in the second basic cell column 300B that forms the NAND gate 330, a signal is inputted in the gates 140 and 150 of the P-type and N-type MOS transistors through a contact provided at an end of the gates 140 and 150 that are disposed in vertical alignment with one another. This is different from the wiring pattern shown in FIG. 7 in which a signal is inputted at a section generally intermediate of the gates 140 and 150 that are disposed in vertical alignment with one another. Therefore, the wiring pattern shown in FIG. 3 effectively uses the gates 140 and 150 as wiring materials.

It is noted that the present invention is not limited to the embodiments described above, and a variety of modifications can be made within the scope of the subject matter of the present invention.

For example, the present invention is not only applicable to split-gate type basic cells, but also applicable to common-gate type basic cells. The present invention is applicable to placement and routing for master slices that have a variety of basic cells mounted thereon.

Figure 6:
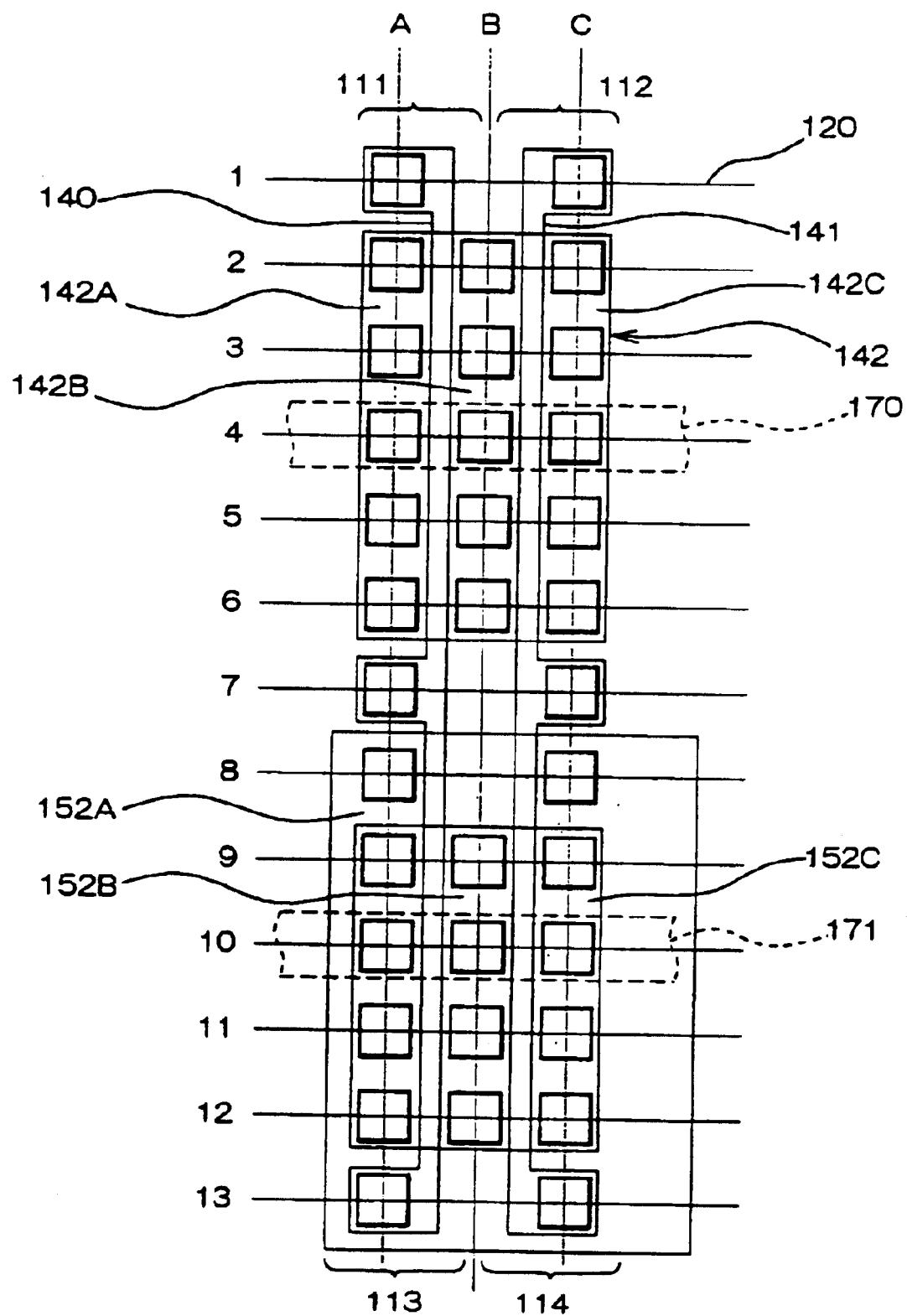
FIG. 6 is a schematical illustration of definitions for effective pin positions in which the present invention is implemented in a common gate type basic cell in accordance with one embodiment of the present invention.

FIG. 6 is an illustration of definitions for effective pin positions when the present invention is applied to common-gate type basic cells. Table 2 below shows the definitions for effective pin positions shown in FIG. 6.

TABLE 2

| TYPE | PIN DEFINITIONS | |
|---|---|---|
| | OBJECT | COORDINATES |
| P | First Gate | A1, A7 |
| M | Second Gate | C1, C7 |
| O | First Diffusion Region | A2–A6 |
| S | Second Diffusion Region | B2–B6 |
| | Third Diffusion Region | C2–C6 |
| N | First Gate | A7, A13 |
| M | Second Gate | C7, C13 |
| O | First Diffusion Region | A8–A12 |
| S | Second Diffusion Region | B8–B12 |
| | Third Diffusion Region | C8–C12 |

In Table 2 above, the definitions for effective pin positions of the first gate of the P-type MOS transistor and the first gate of the N-type MOS transistor commonly use the coordinate A7. Similarly, the definitions for effective pin positions of the second gate of the P-type MOS transistor and the second gate of the N-type MOS transistor commonly use the coordinate C7.

Further, the present invention is applicable to a stackable wiring method in which contacts overlap vias as viewed in a plan view. In this case, the use of a stackable wiring method is effective when the first and second power source wirings 170A and 171A are formed with the second metal wiring layers.

What is claimed is:

1. A design method for designing a master slice semiconductor integrated circuit having a placing and wiring method for a master slice type semiconductor integrated circuit conducted by an automatic placing and routing apparatus with respect to a master slice having a plurality of basic cells formed in a matrix, in which first and second power source wirings that are formed along a first direction and traverse the plurality of basic cells are connected to a plurality of signal wirings that are formed along the first direction or a second direction that traverses the first direction to provide connections within each of the plurality of basic cells and/or between the plurality of basic cells, the design method comprising:

first step of registering in the automatic pacing and routing apparatus that defines the first direction or the second direction as a priority wiring direction definitions of effective pin positions that connect the plurality of signal wirings, the plurality of first and second power source wirings and the plurality of basic cells for each of layers in which the wirings are formed;

second step of registering a net list that defines connections among the plurality of basic cells in the automatic placing and routing apparatus; and third step of determining placement of actual pin positions and wiring routes for the first and second power source wirings and the plurality of signal wirings based on data of the definitions of the effective pin positions and the net list, wherein the first step includes the step of defining the effective pin positions inside and outside a region between the first power source wiring and the second power source wiring, in a region corresponding to one of a plurality of component layers with which transistors of the plurality of basic cells are formed and on lattice grids along which the plurality of basic cells are formed, and the third step includes the step of connecting one of the plurality of component layers and two of the plurality of signal wirings at the determined pin positions, in which the two of the plurality of signal wirings are connected by the one component layer alone.

2. A design method for designing a master slice type semiconductor integrated circuit according to claim 1, wherein the one component layer is a diffusion layer.

3. A design method for designing a master slice type semiconductor integrated circuit according to claim 2, wherein the first step includes the step of providing a plurality of the effective pin positions defined at positions on the diffusion layer both inside and outside the region between the first power source wiring and the second power source wiring.

4. A design method for designing a master slice type semiconductor integrated circuit according to claim 2, wherein the first step defines effective pin positions at all of the intersections of lattice grids on the diffusion layer.

5. A design method for designing a master slice type semiconductor integrated circuit according to any one of claim 2 through claim 4, wherein the basic cell includes a plurality of P-type transistors and a plurality of N-type transistors, and the basic cell is formed in a split-gate type in which a gate layer is provided for each of the plurality of P-type transistors and N-type transistors.

6. A design method for designing a master slice type semiconductor integrated circuit according to claim 5, wherein, in the first step, an effective pin position defined for each of the gate layers is provided in each of areas inside and outside the region between the first power source wiring and the second power source wiring.

7. A design method for designing a master slice type semiconductor integrated circuit according to any one of claim 2 through claim 4, wherein the basic cell includes a plurality of P-type transistors and a plurality of N-type transistors, and the basic cell is formed in a common-gate type in which a common gate layer is provided for the plurality of P-type transistors and N-type transistors.

8. A design method for designing a master slice type semiconductor integrated circuit according to claim 7, wherein, in the first step, an effective pin position defined for each of the common gate layers is provided in an area inside the region between the first power source wiring and the second power source wiring, and another effective pin position is provided at each end of the common gate layer outside the region.

9. A design method for designing a master slice semiconductor integrated circuit including a placing and wiring method for a master slice type semiconductor integrated circuit conducted by an automatic placing and routing apparatus with respect to a master slice having a plurality of basic cells formed in a matrix, in which first and second power source wirings that are formed along a first direction and traverse the plurality of basic cells are connected to a plurality of signal wirings that are formed along the first direction or a second direction that traverses the first direction to provide connections within each of the plurality of basic cells and/or between the plurality of basic cells, the design method comprising:

first step of registering in the automatic pacing and routing apparatus that defines the first direction or the second direction as a priority wiring direction definitions of effective pin positions that connect the plurality of signal wirings, the plurality of first and second power source wirings and the plurality of basic cells for each of layers in which the wirings are formed;

second step of registering a net list that defines connections among the plurality of basic cells in the automatic placing and routing apparatus; and third step of determining placement of actual pin positions and wiring routes for the first and second power source wirings and the plurality of signal wirings, based on data of the definitions of the effective pin positions and the net list, wherein the first step includes the step of defining the effective pin positions inside and outside a region between the first power source wiring and the second power source wiring, in a region corresponding to a gate layer of each of transistors that form the plurality of basic cells and on lattice grids along which the plurality of basic cells are disposed.

10. A master slice type semiconductor integrated circuit comprising:

a substrate having a plurality of basic cells formed in a matrix thereon;

first and second power source wirings that are formed along a first direction and traverse the plurality of basic cells;

a plurality of signal wirings that are formed along the first direction or a second direction that traverses the first direction to provide connections within each of the plurality of basic cells and/or between the plurality of basic cells; and two contacts that connect one of a plurality of component layers that form each of the plurality of basic cells to two of the plurality of signal wirings, wherein the two contacts are respectively disposed inside and outside a region between the first and second power source wirings, and the two wirings are connected to each other by the one component layer alone.

11. A master slice type semiconductor integrated circuit according to claim 10, wherein the one component layer is a diffusion layer.

12. A master slice type semiconductor integrated circuit according to claim 10 or claim 11, wherein the basic cell includes a plurality of P-type transistors and a plurality of N-type transistors, and the basic cell is formed in a split-gate type in which a gate layer is provided for each of the plurality of P-type transistors and N-type transistors.

13. A master slice type semiconductor integrated circuit according to claim 12, wherein the one component layer is a gate layer.

14. A master slice type semiconductor integrated circuit according to claim 10 or claim 11, wherein the basic cell includes a plurality of P-type transistors and a plurality of N-type transistors, and the basic cell is formed in a common-gate type in which a common gate layer is provided for the plurality of P-type transistors and N-type transistors.

15. A master slice type semiconductor integrated circuit according to claim 14, wherein contacts are provided for the common gate layer outside the region between the first and second power source wirings.

16. A master slice type semiconductor integrated circuit designed according to the method has:

a substrate having a plurality of basic cells formed in a matrix thereon, first and second power source wirings that are formed along a first direction and traverse the plurality of basic cells, a plurality of signal wirings that are formed along the first direction or a second direction that traverses the first direction to wires within each of the plurality of basic cells and/or between the plurality of basic cells, and a contact that connects one of the gate layers of transistors that form one of the plurality of basic cells to one of the plurality of signal wirings in an area outside a region between the first power source wiring and the second power source wiring.

* * * * *